(12) United States Patent  
Hayashi

(10) Patent No.: US 10,993,321 B2  
(45) Date of Patent: Apr. 27, 2021

(54) WIRING SUBSTRATE

(71) Applicant: NGK SPARK PLUG CO., LTD., Nagoya (JP)

(72) Inventor: Takahiro Hayashi, Nagoya (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 0 days.

(21) Appl. No.: 16/504,673

(22) Filed: Jul. 8, 2019

(65) Prior Publication Data

US 2020/0029431 A1 Jan. 23, 2020

(30) Foreign Application Priority Data

Jul. 20, 2018 (JP) .............................. JP2018-136273

(51) Int. Cl.
  *H05K 1/11* (2006.01)
  *H05K 1/03* (2006.01)
  *H05K 1/09* (2006.01)

(52) U.S. Cl.
  CPC ........... *H05K 1/113* (2013.01); *H05K 1/0306* (2013.01); *H05K 1/09* (2013.01);
  (Continued)

(58) Field of Classification Search
  CPC ......... H05K 1/115; H05K 2201/09636; H05K 2201/096; H05K 2201/0979;
  (Continued)

(56) References Cited

U.S. PATENT DOCUMENTS

| | | | |
|---|---|---|---|
| 9,001,522 B2* | 4/2015 | Chen | H05K 1/111 361/767 |
| 2005/0156319 A1* | 7/2005 | Oggioni | H01L 23/49827 257/774 |

(Continued)

FOREIGN PATENT DOCUMENTS

| | | |
|---|---|---|
| JP | 2006-270081 A | 10/2006 |
| JP | 2012028730 A | 2/2012 |

(Continued)

OTHER PUBLICATIONS

USPTO, Office Action in U.S. Appl. No. 16/478,164, dated May 20, 2020.

(Continued)

*Primary Examiner* — Roshn K Varghese
(74) *Attorney, Agent, or Firm* — Sites & Harbison, PLLC; Jeffrey A. Haeberlin; James R. Hayne

(57) ABSTRACT

A wiring substrate has a substrate body formed by a single or a plurality of insulating layers and having front and back surfaces located at opposite sides of the substrate body; a plurality of pads formed on at least one of the front surface, the back surface and an inner layer surface that is located between the front and back surfaces, and having a staggered arrangement in plan view; and a plurality of via conductors formed at each of the pads, extending in a thickness direction of the substrate body with the plurality of via conductors being parallel to each other and connecting the pads located on different surfaces. Arrangement, in plan view, of the plurality of via conductors connecting to the pad and arrangement, in plan view, of the plurality of via conductors connecting to an adjacent pad located on the same surface are different from each other.

10 Claims, 3 Drawing Sheets

(52) U.S. Cl.
CPC .............. *H05K 2201/0939* (2013.01); *H05K 2201/09381* (2013.01); *H05K 2201/09409* (2013.01); *H05K 2201/09418* (2013.01)

(58) Field of Classification Search
CPC .......... H05K 2201/09709; H05K 2201/09618; H05K 2201/09627; H05K 2201/09609; H05K 2201/09418; H05K 2201/097; H05K 1/113; H05K 1/0306; H05K 1/09; H05K 1/116; H05K 1/0271; H05K 1/111; H05K 2201/09381; H05K 2201/0939; H05K 2201/09409; H05K 3/4629

See application file for complete search history.

(56) References Cited

U.S. PATENT DOCUMENTS

| | | | |
|---|---|---|---|
| 2007/0060970 A1* | 3/2007 | Burdon | A61N 1/3754 607/37 |
| 2008/0277786 A1* | 11/2008 | Chen | H01L 23/3677 257/738 |
| 2010/0032196 A1* | 2/2010 | Kaneko | H01L 21/4846 174/260 |
| 2011/0048775 A1* | 3/2011 | Ishida | H05K 1/115 174/258 |
| 2012/0018193 A1 | 1/2012 | Hong | |
| 2013/0319737 A1* | 12/2013 | Hurwitz | H01L 23/49827 174/257 |
| 2015/0107880 A1 | 4/2015 | Kim et al. | |
| 2015/0189751 A1* | 7/2015 | Akahoshi | H05K 3/427 174/262 |
| 2015/0305155 A1* | 10/2015 | Shiroshita | H05K 1/0228 174/266 |
| 2017/0208677 A1* | 7/2017 | Kogure | H01L 23/49894 |
| 2018/0168039 A1* | 6/2018 | Numagi | H01L 23/48 |

FOREIGN PATENT DOCUMENTS

| | | |
|---|---|---|
| JP | 2018198271 A | 12/2018 |
| WO | 2016/052284 A1 | 6/2017 |

OTHER PUBLICATIONS

Japan Patent Office, Office Action (Notice of Reasons for Refusal) issued in corresponding Application No. 2018-136273, dated Jul. 28, 2020.

USPTO, Office Action in U.S. Appl. No. 16/478,164, dated Aug. 24, 2020.

* cited by examiner

WIRING SUBSTRATE

BACKGROUND OF THE INVENTION

The present invention relates to a wiring substrate having a substrate body formed by a single or a plurality of insulating layers and a plurality of via conductors formed along a thickness direction of the substrate body and connecting upper and lower layer side pads.

For example, Japanese Unexamined Patent Application No. 2012-028730 (hereinafter is referred to as "JP2012-028730") discloses a multi-layer wiring substrate and its manufacturing method. In JP2012-028730, a multi-layer insulating substrate is formed by layering a plurality of insulating layers each having thereon wiring patterns, and a plurality of via electrodes are formed at the multi-layer insulating substrate with the via electrodes stacked along a thickness direction of the multi-layer insulating substrate. The wiring patterns formed on different insulating layers are connected in series through the via electrodes. One via electrode is formed from a via group including a plurality of parallel-arranged via units (via conductors). Arrangement in plan view of the parallel-arranged via units of the via group of each via electrode is different from that of the adjacently-stacked via electrode.

According to JP2012-028730, failures due to a short circuit between the layers of the multi-layer insulating substrate and due to a short circuit between the wiring pattern and the via electrode are prevented, and a multi-layer wiring substrate having high electrical connectivity (good electric characteristics) between extremely-small-sized via electrodes can be obtained.

SUMMARY OF THE INVENTION

Here, in a case where a plurality of pads like JP2012-028730 are arranged in a grid pattern in plan view on the insulating layer located between the pair of upper and lower pads, one or the plurality of via conductors connected to the pad and those connected to the respective adjacent pads arranged in a plane direction on the same insulating layer may be arranged linearly or in a straight line in plan view. In this case, if stress occurs due to a difference in coefficient of thermal expansion between the insulating layer and the via conductor, the stress concentrates along the linearly-arranged plurality of via conductors. Because of this, cracks in the plane direction and in the thickness direction of the insulating layer may appear along the linearly-arranged via conductors, and this may cause undesirable short circuit between the adjacent via conductors.

The present invention was made in view of the above technical problem. An object of the present invention is therefore to provide a wiring substrate that is capable of reducing the tendency for the crack to appear at the insulating layer, which is caused by the arrangement of the plurality of via conductors, even if the plurality of via conductors of the plurality of pads are arranged parallel at each layer located between the plurality of pairs of pads.

In order to solve the above technical problem, when the plurality of pads are formed in a zigzag formation (a staggered arrangement) on each insulating layer and the plurality of via conductors of the plurality of pads are formed so as to be arranged parallel at each insulating layer, the plurality of via conductors connecting to the pad and the plurality of via conductors connecting to an adjacent pad are arranged differently from each other in plan view.

That is, according to one aspect of the present invention, a wiring substrate comprises: a substrate body formed by a single or a plurality of insulating layers and having a front surface and a back surface that are located at opposite sides of the substrate body; a plurality of pads formed on at least one of the front surface, the back surface and an inner layer surface that is located between the front and back surfaces, the plurality of pads having a staggered arrangement in plan view; and a plurality of via conductors formed at each of the plurality of pads, the plurality of via conductors extending in a thickness direction of the substrate body with the plurality of via conductors being parallel to each other and connecting the pads located on different surfaces. And an arrangement, in plan view, of the plurality of via conductors connecting to the pad and an arrangement, in plan view, of the plurality of via conductors connecting to an adjacent pad located on the same surface are different from each other.

The other objects and features of this invention will become understood from the following description with reference to the accompanying drawings.

DETAILED DESCRIPTION OF THE INVENTION

Embodiments of the present invention will be explained with reference to the drawings.

Figure 1A:
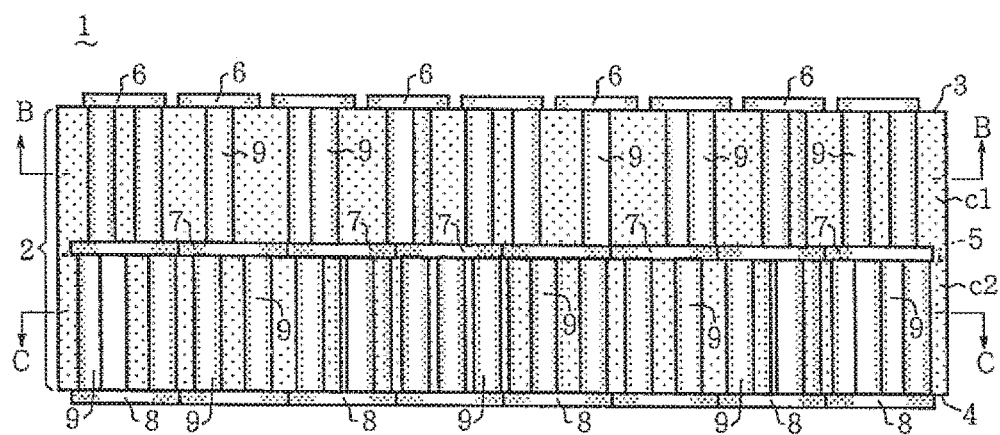
FIG. 1A is a vertically-cut cross section of a wiring substrate according to an embodiment of the present invention.
Figure 1B:
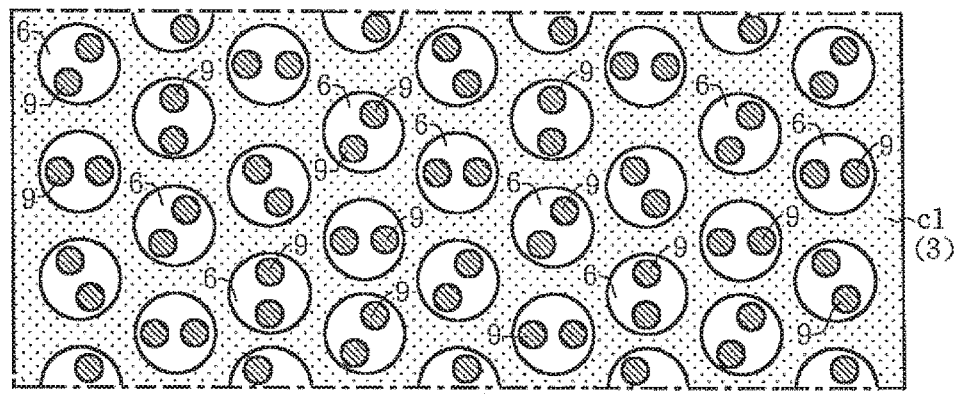
FIG. 1B is a cross section cut by a plane passing through a B-B line of FIG. 1.
Figure 1C:
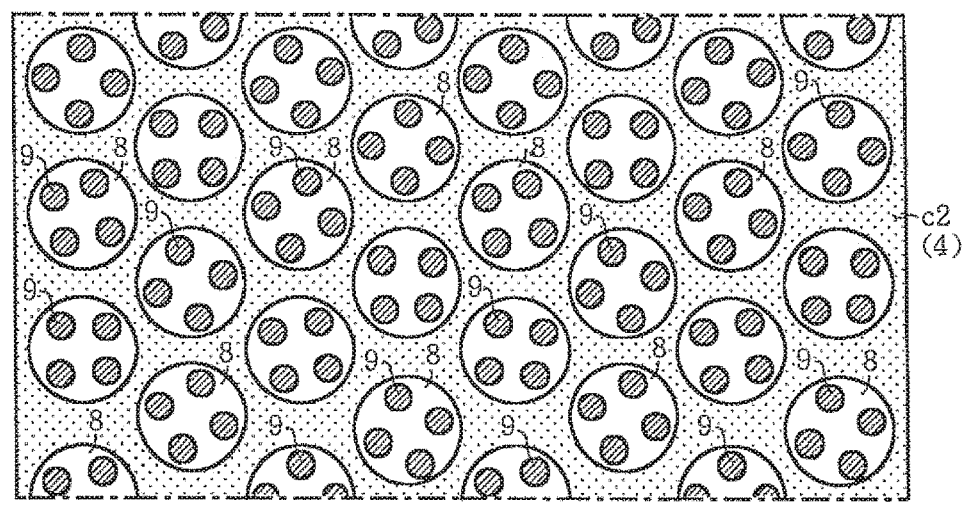
FIG. 1C is a cross section cut by a plane passing through a C-C line of FIG. 1.
Figure 2:
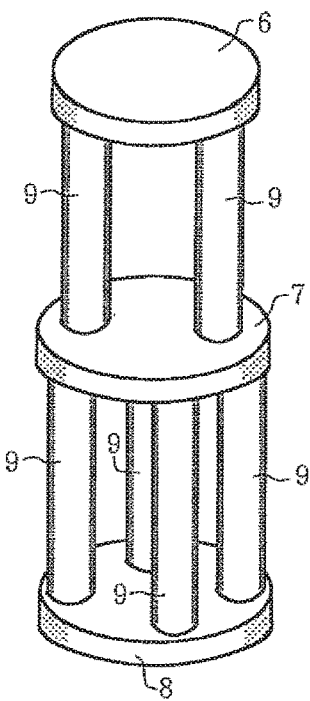
FIG. 2 is a perspective view showing three pads located in a thickness direction of the wiring substrate and a plurality of via conductors connecting these pads.

FIG. 1A is a vertically-cut cross section of a wiring substrate 1 according to an embodiment of the present invention. FIG. 1B is a cross section cut by a plane passing through a B-B line of FIG. 1. FIG. 1C is a cross section cut by a plane passing through a C-C line of FIG. 1.

As shown in FIG. 1A, the wiring substrate 1 is formed by upper and lower ceramic layers (a plurality of insulating layers) c1 and c2. The wiring substrate 1 has a substrate body 2 having a front surface 3 and a back surface 4 which are located at opposite sides of the substrate body 2, a plurality of front surface pads 6, a plurality of back surface pads 8 and a plurality of inner layer pads 7 which are formed in a zigzag formation (a staggered arrangement) in plan view on the front surface 3, the back surface 4 and an inner layer surface 5 respectively, a plurality of via conductors 9 penetrating the ceramic layer c1 and connecting the front surface pad 6 and the inner layer pad 7 in a thickness direction of the substrate body 2 and penetrating the ceramic layer c2 and connecting the inner layer pad 7 and the back surface pad 8 in the thickness direction of the substrate body 2.

The ceramic layers c1 and c2 are made of e.g. alumina. Each of the pads 6 to 8 and the via conductor 9 are made of mainly tungsten (W) or molybdenum (Mo). The ceramic layer cn forming the substrate body 2 could be three layers or more. In this case, the number of the inner layer surface 5 and the number of the inner layer pad 7 are also increased with increase in the number of the ceramic layer, and the plurality of via conductors 9 are formed between increased upper and lower inner layer pads 7 and connect these inner layer pads 7 in the thickness direction.

As shown in FIGS. 1A to 1C, the number of via conductors 9, which penetrate the upper ceramic layer c1 of the substrate body 2 and connect one of the front surface pads 6 formed in the zigzag formation (the staggered arrangement) on the front surface 3 and corresponding one of the inner layer pads 7 formed in the zigzag formation (the staggered arrangement) on the inner layer surface 5, is two. On the other hand, the number of via conductors 9, which penetrate the lower ceramic layer c2 of the substrate body 2 and connect one of the inner layer pads 7 formed in the zigzag formation (the staggered to arrangement) on the inner layer surface 5 and corresponding one of the back surface pads 8 formed in the zigzag formation (the staggered arrangement) on the back surface 4, is four.

As can be seen in FIGS. 1A to 1C and 2, a diameter of the front surface pad 6 is set to be smaller than those of the inner layer pad 7 and the back surface pad 8.

Further, each of the pads 6 to 8 is formed into a circular shape in plan view. However, their shapes could be a rectangular shape (a square) as mentioned later.

As shown in FIG. 1B, as regards formation (or arrangement) of the two via conductors 9 penetrating the upper ceramic layer c1 and connecting one front surface pad 6 formed on the front surface 3 and corresponding one inner layer pad 7 formed on the inner layer surface 5, a group of these two via conductors 9 (i.e. a via conductor 9 pair) is arranged so as to be shifted in a rotation direction in plan view by 30 degrees, 60 degrees or 90 degrees with respect to other group of the two via conductors 9 (i.e. other via conductor 9 pair) connecting to any one of the adjacent front surface pads 6 arranged in the plane direction (in longitudinal, lateral and oblique directions) along the front surface 3. These shifting angles could be set to an arbitrary angle as long as the shifting angle is 30 degrees or greater and 90 degrees or smaller.

With this arrangement, none of the via conductors 9 connecting the plurality of front surface pads 6 and the plurality of inner layer pads 7 are aligned with each other or are arranged linearly or in a straight line in the longitudinal, lateral and oblique directions in plan view. In this example, the two via conductors 9 connecting to one pad 6 (7) among the plurality of adjacent pads 6 (7) correspond to the plurality of via conductors 9 connecting to each pad 6 (7).

As shown in FIG. 1C, as regards formation (or arrangement) of the four via conductors 9 penetrating the lower ceramic layer c2 and connecting one inner layer pad 7 formed on the inner layer surface 5 and corresponding one back surface pad 8 formed on the back surface 4, a group of these four via conductors 9 (i.e. a set of four via conductors 9) is arranged so as to be shifted in a rotation direction in plan view by 30 degrees, 45 degrees, 60 degrees or 90 degrees with respect to other group of the four via conductors 9 (i.e. other set of four via conductors 9) connecting to any one of the adjacent back surface pads 8 arranged in the plane direction (in longitudinal, lateral and oblique directions) along the back surface 4. These shifting angles could be set to an arbitrary angle as long as the shifting angle is 10 degrees or greater and 90 degrees or smaller.

With this arrangement, none of the via conductors 9 connecting the plurality of inner layer pads 7 and the plurality of back surface pads 8 are aligned with each other or are arranged linearly or in a straight line in the longitudinal, lateral and oblique directions in plan view. In this example, the four via conductors 9 connecting to one pad 7 (8) among the plurality of adjacent pads 7 (8) correspond to the plurality of via conductors 9 connecting to each pad 7 (8).

Further, as shown in FIGS. 1A to 1C and 2, in the wiring substrate 1, the number of via conductors 9 penetrating the upper ceramic layer c1 and connecting the front surface pad 6 and the inner layer pad 7 is two, whereas the number of via conductors 9 penetrating the lower ceramic layer c2 and connecting the inner layer pad 7 and the back surface pad 8 is four.

The number of via conductors 9 is properly set according to an amount of power to be supplied to the front surface 3 side from the back surface 4 side and an electrical resistance occurring upon supplying the power.

For instance, both of the number of via conductors 9 penetrating the upper ceramic layer c1 and connecting the front surface pad 6 and the inner layer pad 7 and the number of via conductors 9 penetrating the lower ceramic layer c2 and connecting the inner layer pad 7 and the back surface pad 8 could be two or might be four.

Figure 3:
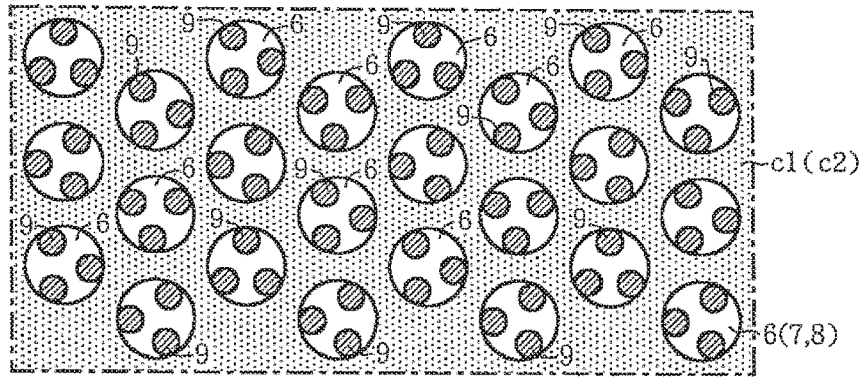
FIG. 3 is a sectional view, cut in the same manner as the above embodiment, showing an embodiment in which the via conductors, the number of which is different from that of the above embodiment, are connected to a plurality of pads.

Furthermore, as shown in FIG. 3, the number of via conductors 9 penetrating the upper ceramic layer c1 and connecting the front surface pad 6 and the inner layer pad 7 could be three. As regards formation (or arrangement) of the three via conductors 9 penetrating the upper ceramic layer c1 and connecting one front surface pad 6 and corresponding one inner layer pad 7, a group of these three via conductors 9 (i.e. a set of three via conductors 9) is arranged so as to be shifted in a rotation direction in plan view by 30 degrees, 60 degrees or 90 degrees with respect to other group of the three via conductors 9 (i.e. other set of three via conductors 9) connecting to any one of the adjacent front surface pads 6 arranged in the plane direction along the front surface 3. These shifting angles could be set to an arbitrary angle as long as the shifting angle is 10 degrees or greater and 90 degrees or smaller.

With this arrangement, none of the via conductors 9 connecting the plurality of front surface pads 6 and the plurality of inner layer pads 7 are aligned with each other or are arranged linearly or in a straight line in the longitudinal, lateral and oblique directions in plan view. In this example, the three via conductors 9 connecting to one pad 6 (7) among the plurality of adjacent pads 6 (7) correspond to the plurality of via conductors 9 connecting to each pad 6 (7).

Here, the number of via conductors 9 penetrating the lower ceramic layer c2 and connecting the inner layer pad 7 and the back surface pad 8 could be three.

As described above, the wiring substrate 1 has a configuration in which the plurality of via conductors 9 are formed in each ceramic layer and connect pads 6 and 7 and also pads 7 and 8 formed in the zigzag formation (the staggered arrangement) on the surfaces 3, 5 and 4 respectively, and the formation (or the arrangement), in plan view, of the plurality of via conductors 9 is different between adjacent pads. This can reduce the possibility that the plurality of via conductors 9 will align or be arranged linearly or in a straight line in plan view for each layer. Hence, even if stress occurs due to a difference in coefficient of thermal expansion between the insulating layer (the ceramic layer) and the via conductor, an occurrence of crack at the ceramic layers c1 and c2 caused by the stress can be suppressed. The wiring substrate 1 having excellent electric characteristics can therefore be formed with high accuracy of size and shape of each component.

Further, the plurality of inner layer pads 7 are formed in the zigzag formation (the staggered arrangement) on the inner layer surface 5 that is sandwiched between the upper and lower ceramic layers c1 and c2 in the thickness direction of the substrate body 2. And, the formation (or the arrangement), in plan view, of the plurality of via conductors 9 penetrating the upper ceramic layer c1 and connecting to the front surface pads 6 and the formation (or the arrangement), in plan view, of the plurality of via conductors 9 penetrating the lower ceramic layer c2 and connecting to the back surface pads 8 are different from each other. This can also reduce the possibility that the plurality of via conductors 9 will align or be arranged linearly or in a straight line in plan view through layers layered in the thickness direction of the substrate body 2. Hence, it is possible to reduce the tendency for the crack to appear in the plane direction along the inner layer surface 5 and in the thickness direction of the substrate body 2. The wiring substrate 1 having rather excellent electric characteristics can therefore be formed with higher accuracy of size and shape of each component.

Therefore, by the wiring substrate 1 having the above structure or configuration, the above effects (corresponding to after-mentioned effects (1) and (2)) can be easily obtained.

Figure 4:
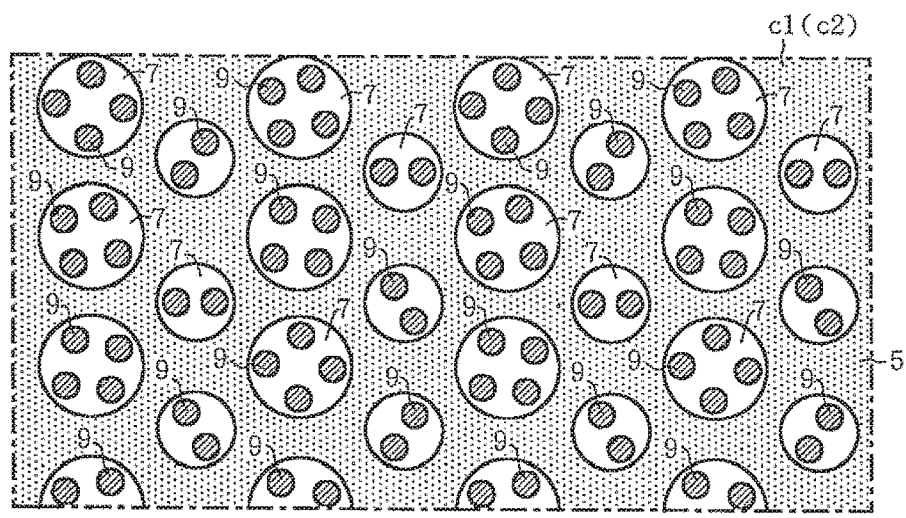
FIG. 4 is a sectional view, cut in the same manner as the above embodiment, showing an embodiment in which a plurality of via conductors, the number of which is different depending on a diameter size of the pad, are connected to the different-sized plurality of pads.

FIG. 4 is a sectional view, cut in the same manner as the above embodiment, showing an embodiment of the inner layer pad 7 and the via conductor 9. In this embodiment, a plurality of relatively-large-sized circular inner layer pads 7 and a plurality of relatively-small-sized circular inner layer pads 7 are arranged in lines with these lines of the large-sized and small-sized inner layer pads 7 being alternately arranged in right and left directions. Further, arrangement as a whole of the inner layer pads 7 on the inner layer surface 5 is the staggered arrangement in plan view. Moreover, the number of via conductors 9 connecting the front surface pad 6 and the inner layer pad 7 is four, whereas the number of via conductors 9 connecting the inner layer pad 7 and the back surface pad 8 is two.

As can be seen in FIG. 4, one large-sized inner layer pad 7 is placed so as to be enclosed with four small-sized inner layer pads 7 at upper right and left sides and lower right and left sides (at oblique upper and lower directions) of the one large-sized inner layer pad 7. And also, one small-sized inner layer pad 7 is placed so as to be enclosed with four large-sized inner layer pads 7 at upper right and left sides and lower right and left sides (at oblique upper and lower directions) of the one small-sized inner layer pad 7.

As for the via conductor 9, formation (or arrangement), in plan view, of a group of four via conductors 9 (i.e. a set of four via conductors 9) connecting to the large-sized inner layer pad 7 is shifted so as to rotate in a plane direction of the inner layer surface 5 by 30 degrees or 45 degrees with respect to other groups of the four via conductors 9 (i.e. other sets of four via conductors 9) connecting to the adjacent large-sized inner layer pads 7 to the above large-sized inner layer pad 7 in up and down directions of FIG. 4.

On the other hand, formation (or arrangement), in plan view, of a group of two via conductors 9 (i.e. a via conductor 9 pair) connecting to the small-sized inner layer pad 7 is shifted so as to rotate in the plane direction of the inner layer surface 5 by 60 degrees with respect to other groups of the two via conductors 9 (i.e. other via conductor 9 pairs) connecting to the adjacent small-sized inner layer pads 7 to the above small-sized inner layer pad 7 in the up and down directions of FIG. 4.

Further, as shown in FIG. 4, the four via conductors 9 connecting to the large-sized inner layer pad 7 and the two via conductors 9 connecting to the adjacent small-sized inner layer pads 7 are not aligned with each other or are not arranged linearly or in a straight line along the plane direction of the inner layer surface 5 in plan view.

Therefore, even in the case where, as shown in FIG. 4, the plurality of large-sized and small-sized inner layer pads 7 are formed in the zigzag formation (the staggered arrangement) and the four via conductors 9 and the two via conductors 9 are each connected to these large-sized and small-sized inner layer pads 7, the above-mentioned effects (corresponding to after-mentioned effects (1) and (2)) can also be easily obtained.

Figure 5A:
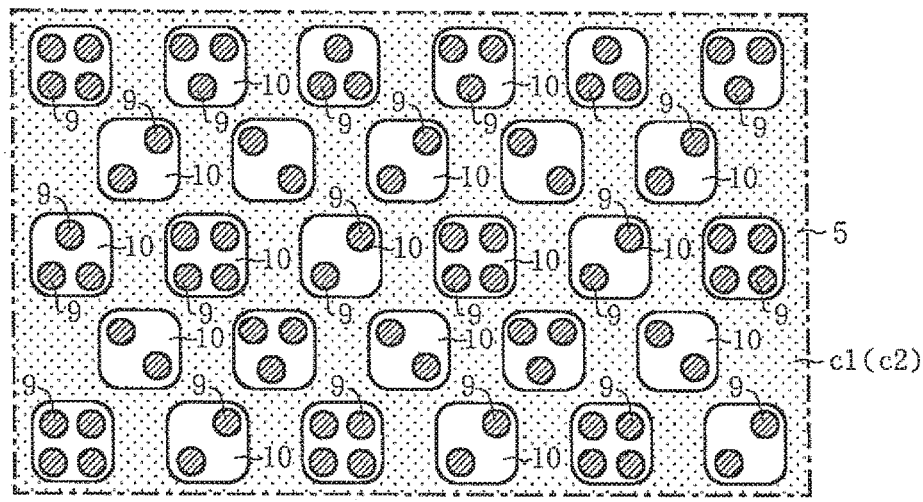
FIGS. 5A and 5B are sectional views showing embodiments in which a plurality of via conductors are connected to a plurality of pads whose shape is different from that of the above embodiment.

FIG. 5A is a sectional view, cut in the same manner as the above embodiment, showing an embodiment of the pad and the via conductor. In this embodiment, a plurality of pads 10 shaped into a square (a rectangular shape) in plan view and having at four round corners are formed in the zigzag formation (the staggered arrangement) on the inner layer surface 5. Further, as can be seen in FIG. 5A, some of the pads 10 each have four via conductors 9 (a plurality of via conductors 9) at four corners. Some of the pads 10 each have two via conductors 9 (a plurality of via conductors 9) at diagonally-located two corners. Some of the pads 10 each have three via conductors 9 (a plurality of via conductors 9) at adjacently-located two corners and in the middle of a side that is separate from these two corners. And, some of the pads 10 each have two via conductors 9 (a plurality of via conductors 9) at the other diagonally-located two corners.

As shown in FIG. 5A, arrangement as a whole of the two to four via conductors 9 connecting to the plurality of pads 10 is an arrangement in which the via conductors 9 are not aligned with each other or are not arranged linearly or in a straight line along the plane direction of the inner layer surface 5 in plan view.

Figure 5B:
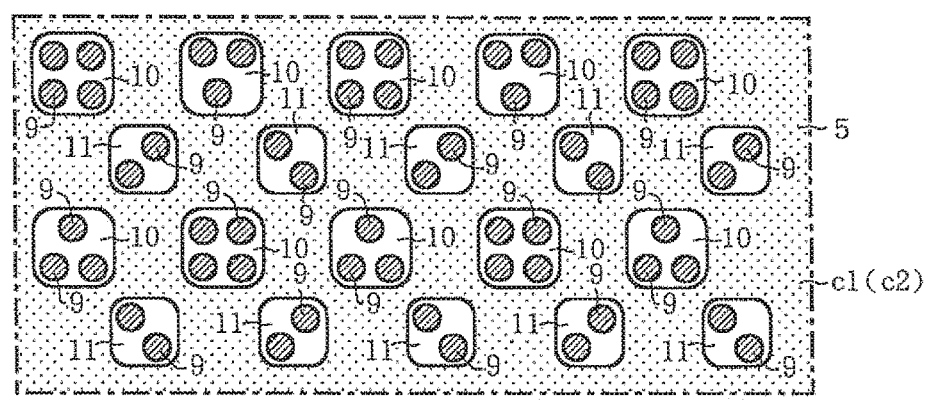

FIG. 5B is a sectional view, cut in the same manner as the above embodiment, showing an embodiment of the pad and the via conductor. In this embodiment, on the inner layer surface 5, the same pads 10 as the above embodiment are arranged in a grid pattern, and pads 11, each of which is a similar shape to the pad 10 and is shaped into a smaller square than the pad 10, are each placed at a substantially middle position of four pad 10. Further, arrangement as a whole of the pads 10 and 11 is the staggered arrangement in plan view. In the same manner as the above embodiment, four or three via conductors 9 are connected to the pad 10, whereas two via conductors 9 (a plurality of via conductors 9) are connected to the pad 11 at the diagonally-located two corners.

As shown in FIG. 5B, arrangement as a whole of the two to four via conductors 9 connecting to the plurality of pads 10 and 11 is an arrangement in which the via conductors 9 are not aligned with each other or are not arranged linearly or in a straight line along the plane direction of the inner layer surface 5 in plan view.

Figure 5C:
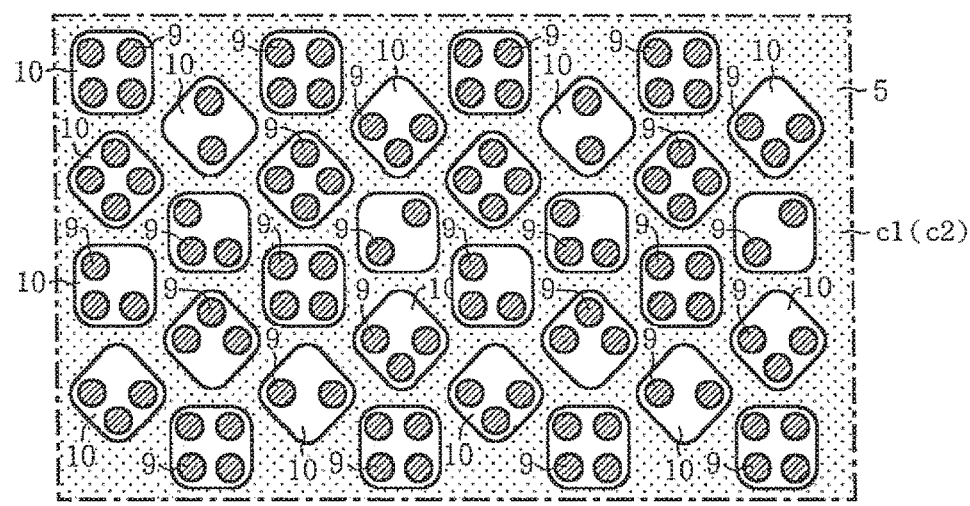
FIG. 5C is a sectional view showing an embodiment in which arrangement (orientation or attitude) of the adjacent pads is changed to a staggered arrangement.

FIG. 5C is a sectional view, cut in the same manner as the above embodiment, showing an embodiment of the pad and the via conductor. In this embodiment, orientation or attitude of the pad 10 is shifted so as to rotate by 45 degrees with respect to the adjacent pads 10 to the above pad 10 in the up and down directions of FIG. 5C. Further, arrangement of these pads 10 is the staggered arrangement along the right and left directions in plan view. In the same manner as the above embodiment, the two to four via conductors 9 are connected to the pad 10.

As shown in FIG. 5C, arrangement as a whole of the two to four via conductors 9 connecting to the plurality of pads 10 is an arrangement in which the via conductors 9 are not aligned with each other or are not arranged linearly or in a straight line along the plane direction of the inner layer surface 5 in plan view.

Therefore, by the wiring substrate 1 shown in FIGS. 5A to 5C, the above-mentioned effects (corresponding to after-mentioned effects (1) and (2)) can also be easily obtained.

The present invention is not limited to the above embodiments.

In the above embodiments, the insulating layer forming the substrate body 2 is made of alumina. However, the insulating layer could be made of, for instance, ceramic except alumina, e.g. a low temperature simultaneous baking ceramic such as aluminium nitride and mullite, or a low temperature simultaneous baking ceramic such as glass ceramic, or may be resin such as epoxy resin. In a case where the glass ceramic or the resin is used, as material of the pads 6 to 8, 10 and 11 and the via conductor 9, copper or silver is used.

Further, the substrate body 2 could be formed by a single insulating layer, like a relay substrate, or could be formed by three or more insulating layers (i.e. multi-layer structure). In the case of the multi-layer structure, a plurality of insulating layers, each or some of which is made of different material, might be layered.

Furthermore, a shape of the pad could be a regular polygon (such as a triangle, a square, etc.). Moreover, a shape of each corner of the pad could be a round shape.

In addition, a cross section of the via conductor could be an ellipse except for a circle.

The number of via conductors connecting to one pad could be five or more.

From the foregoing, the present invention to includes the following structure or configuration of the wiring substrate, and has the following effects.

A wiring substrate comprises: a substrate body formed by a single or a plurality of insulating layers and having a front surface and a back surface that are located at opposite sides of the substrate body; a plurality of pads formed on at least one of the front surface, the back surface and an inner layer surface that is located between the front and back surfaces, the plurality of pads having a staggered arrangement in plan view; and a plurality of via conductors formed at each of the plurality of pads, the plurality of via conductors extending in a thickness direction of the substrate body with the plurality of via conductors being parallel to each other and connecting the pads located on different surfaces. And, an arrangement, in plan view, of the plurality of via conductors connecting to the pad and an arrangement, in plan view, of the plurality of via conductors connecting to an adjacent pad located on the same surface are different from each other.

According to the above wiring substrate, the following effect (1) can be obtained.

(1) The plurality of via conductors are connected to each of the plurality of pads formed in the zigzag formation (the staggered arrangement), and the arrangement, in plan view, of the plurality of via conductors connecting to one pad and the arrangement, in plan view, of the plurality of via conductors connecting to other pad that is adjacent to the one pad, formed on the same surface (each of the front, back and inner layer surfaces), are different from each other. This arrangement can reduce the possibility that the plurality of via conductors will align or be arranged linearly or in a straight line in plan view on each surface. Hence, even if stress occurs due to a difference in coefficient of thermal expansion between the insulating layer (the ceramic layer) and the via conductor, an occurrence of crack at the wiring substrate caused by the stress can be suppressed. The wiring substrate having excellent electric characteristics can therefore be formed with high accuracy of size and shape of each component.

The insulating layer is made of, e.g. ceramic such as alumina or resin such as epoxy resin.

Further, in a case where the substrate body is formed by a single insulating layer, the plurality of via conductors connect the respective pads formed in the zigzag formation (the staggered arrangement) on the front and back surfaces of the substrate body. As such a wiring substrate, a relay substrate is raised.

Moreover, the pad includes a via cover between the via conductors formed at each insulating layer layered in the thickness direction.

This pad could be used as the front surface pad formed on the front surface of the substrate body, as the back surface pad formed on the back surface, and as the inner layer pad located between the insulating layers.

Further, this pad could be used as the inner layer pad located between the plurality of insulating layers, and could serve as a part of inner layer wiring that forms a predetermined pattern in plan view.

A shape of this pad could be a circle or a regular polygon such as a square in plan view.

The plurality of pads are formed in the zigzag formation (the staggered arrangement) in plan view. The staggered arrangement includes an arrangement pattern (a regular triangle in plan view) in which distances between centers of adjacent plurality of pads are constant (equal to each other), and also includes an arrangement pattern (e.g. an isosceles triangle in plan view) in which distances between centers of adjacent plurality of pads are not equal to each other, except for a grid pattern.

In a case where the number of the via conductors connecting the front surface pad and the back surface pad is two, a set of these two via conductors (i.e. a via conductor pair) is shifted by 10 to 90 degrees with respect to adjacent set of the two via conductors (i.e. adjacent via conductor pair) in plan view.

Further, in a case where the number of the via conductors connecting the front surface pad and the back surface pad is three and the via conductor is formed at each corner of a regular triangle pad, each set of these three via conductors is shifted by 60 degrees.

Furthermore, in a case where the number of the via conductors connecting the front surface pad and the back surface pad is four and the via conductor is formed at each corner of a square pad, each set of these four via conductors is shifted by 45 degrees.

The above three arrangements are applied to a case where two or more insulating layers are layered in the thickness direction from the back surface to the front surface of the substrate body and the plurality of pads and the plurality of via conductors are formed for each layer.

Here, conductive passages that form the plurality of via conductors parallel to each other between the front surface pad and the back surface pad are mainly used for power supply or earth current supply.

In the above wiring substrate, the number of the via conductors connecting to the pad is two, and a group of these two via conductors is arranged so as to be shifted in a rotation direction in plan view by at least 30 degrees or more with respect to other group of two via conductors connecting to one of adjacent pads located on the same surface.

According to the above wiring substrate, the arrangement reduces the possibility that the plurality of via conductors will align or be arranged linearly or in a straight line in plan view for each surface. Therefore, the effect (1) can be surely obtained.

Here, the reason why the shifting angle in the rotation direction is set to 30 degrees or more is because if it is less than 30 degrees, some of the plurality of via conductors tend to easily align or be arranged linearly or in a straight line Further, in the case where the number of the via conductors connecting to the front surface pad and the back surface pad is two, each set of these two via conductors is shifted by 45 degrees or 90 degrees.

In the above wiring substrate, the number of the via conductors connecting to the pad is three or more, the pad is shaped into a triangle or a regular polygon, the via conductor is formed at each corner of the pad, and a group of these three or more via conductors is arranged so as to be shifted in a rotation direction in plan view by at least 10 degrees or more with respect to other group of three or more via conductors connecting to one of adjacent pads located on the same surface.

According to the above wiring substrate, the arrangement reduces the possibility that the plurality of via conductors will align or be arranged linearly or in a straight line in plan view for each surface. Therefore, the effect (1) can be surely obtained.

Here, the reason why the shifting angle in the rotation direction is set to 10 degrees or more is the same as the above reason.

Further, in the case where the number of the via conductors connecting the front surface pad and the back surface pad is three and the via conductor is formed at each corner side (around the corner) of a regular triangle pad, each set of these three via conductors is shifted by 60 degrees.

Furthermore, in the case where the number of the via conductors connecting the front surface pad and the back surface pad is four and the via conductor is formed at each corner side of a square pad, each set of these four via conductors is shifted by 45 degrees.

The above shift in the rotation direction indicates a case where a rotation angle of the group of the three or more via conductors is 10 degrees or more with a center of the pad being a rotation center.

In the above wiring substrate, the numbers of the via conductors connecting to respective adjacent pads located on the same surface are different from each other.

According to the above wiring substrate, since the numbers of the via conductors connecting to respective adjacent pads located on the same surface are different from each other, it is possible to easily prevent the plurality of via conductors from aligning or from being arranged linearly or in a straight line in the plane direction of the inner layer surface. Therefore, the effect (1) can be surely obtained.

In the above wiring substrate, the substrate body is formed by the plurality of insulating layers, the plurality of pads are formed so as to have the staggered arrangement on the inner layer surface located between each adjacent two insulating layers in the thickness direction of the substrate body, and an arrangement, in plan view, of the plurality of via conductors penetrating an upper insulating layer and connecting to the pad and an arrangement, in plan view, of the plurality of via conductors penetrating a lower insulating layer and connecting to the pad are different from each other.

According to the above wiring substrate, in addition to the effect (1), the following effect (2) can be obtained.

(2) The plurality of pads are formed so as to have the staggered arrangement on the inner layer surface located between each adjacent two insulating layers in the thickness direction of the substrate body, and the arrangement, in plan view, of the plurality of via conductors penetrating the upper insulating layer and connecting to the pad and the arrangement, in plan view, of the plurality of via conductors penetrating the lower insulating layer and connecting to the pad are different from each other. Therefore, this arrangement can also reduce the possibility that the plurality of via conductors will align or be arranged linearly or in a straight line in plan view through layers layered in the thickness direction of the substrate body. Hence, it is possible to reduce the tendency for the crack to appear in the plane direction along the inner layer surface and in the thickness direction of the substrate body. The wiring substrate having rather excellent electric characteristics can therefore be formed with higher accuracy of size and shape of each component.

In the above wiring substrate, the number of the via conductors penetrating the upper insulating layer and the number of the via conductors penetrating the lower insulating layer are different from each other.

According to the above wiring substrate, the plurality of pads are formed so as to have the staggered arrangement on the inner layer surface located between each adjacent two insulating layers in the thickness direction of the substrate body, and the number of the via conductors penetrating the upper insulating layer and the number of the via conductors penetrating the lower insulating layer are different from each other. Therefore, the effect (2) can be surely obtained.

The entire contents of Japanese Patent Application No. 2018-136273 filed on Jul. 20, 2018 is incorporated herein by reference.

Although the invention has been described above by reference to certain embodiments of the invention, the invention is not limited to the embodiments described above. Modifications and variations of the embodiment described above will occur to those skilled in the art in light of the above teachings. The scope of the invention is defined with reference to the following claims.

What is claimed is:

1. A wiring substrate comprising:
   a substrate body formed by a single or a plurality of insulating layers and having a front surface and a back surface that are located at opposite sides of the substrate body;
   a plurality of pads formed on the front surface, and at least one of the back surface and an inner layer surface that is located between the front and back surfaces, the plurality of pads formed on the same surface and having a staggered arrangement in plan view; and
   a plurality of via conductors formed at each of the plurality of pads, the plurality of via conductors extending in a thickness direction of the substrate body with the plurality of via conductors being parallel to each other,
   wherein, when focusing attention on one pad among the plurality of pads on the same surface, in plan view, an arrangement of the plurality of via conductors on the one pad is different from an arrangement of the plurality of via conductors on a plurality of immediately adjacent pads that encircle the one pad, wherein a diameter of each of the plurality of pads formed on the at least one of the back surface and inner layer surface is larger than a diameter of each of the plurality of pads formed on the front surface, wherein the number of the via conductors connecting to the one pad is two or more, and wherein a group of these two or more via conductors is arranged so as to be shifted in a rotation direction in plan view by at least 30 degrees or more and 90 degrees or less with respect to other group of two or more via conductors connecting to one of the plurality of immediately adjacent pads located on the same surface.

2. The wiring substrate as claimed in claim 1, wherein:

the number of the via conductors connecting to the one pad is three or more, the one pad is shaped into a triangle or a regular polygon, one of the three or more via conductors connected to the one pad is formed at each corner of the one pad, and a group of these three or more via conductors is arranged so as to be shifted in a rotation direction in plan view by at least 10 degrees or more with respect to other group of three or more via conductors connecting to one of the plurality of immediately adjacent pads located on the same surface.

3. The wiring substrate as claimed in claim 1, wherein:

the numbers of the via conductors connecting to respective adjacent pads located on the same surface are different from each other.

4. The wiring substrate as claimed in claim 1, wherein:

the substrate body is formed by the plurality of insulating layers, the plurality of pads are formed so as to have the staggered arrangement on the inner layer surface located between each adjacent two insulating layers in the thickness direction of the substrate body, and an arrangement, in plan view, of the plurality of via conductors penetrating an upper insulating layer and connecting to the one pad and an arrangement, in plan view, of the plurality of via conductors penetrating a lower insulating layer and connecting to the one pad are different from each other.

5. The wiring substrate as claimed in claim 4, wherein:

the number of the via conductors penetrating the upper insulating layer and the number of the via conductors penetrating the lower insulating layer are different from each other.

6. A wiring substrate comprising:

a substrate body formed by a single or a plurality of insulating layers and having a front surface and a back surface that are located at opposite sides of the substrate body;

a plurality of pads formed on the front surface, and at least one of the back surface and an inner layer surface that is located between the front and back surfaces, the plurality of pads formed on the same surface and having a staggered arrangement in plan view; and a plurality of via conductors formed at each of the plurality of pads, the plurality of via conductors extending in a thickness direction of the substrate body with the plurality of via conductors being parallel to each other, wherein, when focusing attention on one pad among the plurality of pads on the same surface, in plan view, an arrangement of the plurality of via conductors on the one pad is different from an arrangement of the plurality of via conductors on a plurality of immediately adjacent pads that encircle the one pad, wherein a diameter of each of the plurality of pads formed on the at least one of the back surface and inner layer surface is larger than a diameter of each of the plurality of pads formed on the front surface, and wherein the numbers of the via conductors connecting to respective adjacent pads located on the same surface are different from each other.

7. The wiring substrate as claimed in claim 6, wherein:

the number of the via conductors connecting to the one pad is two, and a group of these two via conductors is arranged so as to be shifted in a rotation direction in plan view by at least 30 degrees or more with respect to other group of two via conductors connecting to one of the plurality of immediately adjacent pads located on the same surface.

8. The wiring substrate as claimed in claim 6, wherein:

the number of the via conductors connecting to the one pad is three or more, the one pad is shaped into a triangle or a regular polygon, one of the three or more via conductors connected to the one pad is formed at each corner of the pad, and a group of these three or more via conductors is arranged so as to be shifted in a rotation direction in plan view by at least 10 degrees or more with respect to other group of three or more via conductors connecting to one of the plurality of immediately adjacent pads located on the same surface.

9. The wiring substrate as claimed in claim 6, wherein:

the substrate body is formed by the plurality of insulating layers, the plurality of pads are formed so as to have the staggered arrangement on the inner layer surface located between each adjacent two insulating layers in the thickness direction of the substrate body, and an arrangement, in plan view, of the plurality of via conductors penetrating an upper insulating layer and connecting to the one pad and an arrangement, in plan view, of the plurality of via conductors penetrating a lower insulating layer and connecting to the one pad are different from each other.

10. The wiring substrate as claimed in claim 9, wherein:

the number of the via conductors penetrating the upper insulating layer and the number of the via conductors penetrating the lower insulating layer are different from each other.

* * * * *